(12) United States Patent
Lin

(10) Patent No.: US 7,773,378 B2
(45) Date of Patent: Aug. 10, 2010

(54) HEAT-DISSIPATING STRUCTURE FOR EXPANSION BOARD ARCHITECTURE

(75) Inventor: Tzu Cheng Lin, Shing Tien (TW)

(73) Assignee: Moxa, Inc. (TW)

( * ) Notice: Subject to any disclaimer, the term of this patent is extended or adjusted under 35 U.S.C. 154(b) by 57 days.

(21) Appl. No.: 12/288,702

(22) Filed: Oct. 21, 2008

(65) Prior Publication Data

US 2010/0097769 A1 Apr. 22, 2010

(51) Int. Cl.
*H05K 7/20* (2006.01)

(52) U.S. Cl. ................. 361/690; 361/704; 361/715; 361/721

(58) Field of Classification Search ............. 361/690, 361/715, 721
See application file for complete search history.

(56) References Cited

U.S. PATENT DOCUMENTS

| | | | | |
|---|---|---|---|---|
| 5,671,120 | A * | 9/1997 | Kikinisi | 361/679.41 |
| 6,046,908 | A * | 4/2000 | Feng | 361/707 |
| 6,151,215 | A * | 11/2000 | Hoffman | 361/704 |
| 6,411,514 | B1 * | 6/2002 | Hussaini | 361/704 |
| 6,421,240 | B1 * | 7/2002 | Patel | 361/699 |
| 6,496,375 | B2 * | 12/2002 | Patel et al. | 361/719 |
| 7,136,286 | B2 * | 11/2006 | Chuang | 361/703 |
| 7,257,002 | B2 * | 8/2007 | Nagahashi | 361/704 |
| 7,352,593 | B2 * | 4/2008 | Zeng et al. | 361/810 |
| 7,365,990 | B2 * | 4/2008 | RaghuRam | 361/720 |
| 2003/0218867 | A1 * | 11/2003 | Sawyer et al. | 361/721 |
| 2006/0221573 | A1 * | 10/2006 | Li | 361/704 |

* cited by examiner

*Primary Examiner*—Gregory D Thompson
(74) *Attorney, Agent, or Firm*—Stevens Law Group; David R. Stevens

(57) ABSTRACT

A heat-dissipating structure for the expansion board architecture is provided. A fixing element disposed on the heat-absorbing substrate fixes the motherboard and the first expansion board. The heat-generating elements on the motherboard or the first expansion board are directly in touch with the heat-absorbing surface of the heat-absorbing substrate to absorb their heat. The heat-dissipating board extended from the side of the heat-absorbing substrate then dissipates the heat absorbed by the heat-absorbing substrate. The structure thus solves the problems that existing heat-dissipating structures occupy larger space and therefore cannot be effectively used in an expansion board architecture to dissipate heat produced by the heat-generating elements between the motherboard and the expansion board and that it is likely to have assembly tolerance. Using the structure can reduce the space and the assembly tolerance, but effectively enhance heat dissipation in the expansion board architecture.

17 Claims, 16 Drawing Sheets

HEAT-DISSIPATING STRUCTURE FOR EXPANSION BOARD ARCHITECTURE

BACKGROUND OF THE INVENTION

1. Field of Invention

The invention relates to a heat-dissipating structure and, in particular, to a heat-dissipating structure for the expansion board architecture.

2. Related Art

Technological advances enable electronic devices to have better functions and efficiencies. However, they all generate heat during their operations. If such heat cannot be appropriately dissipated, their efficiencies generally reduce. More seriously, the electronic devices may be burned. Therefore, heat-dissipating devices have become an indispensable part of modern electronic devices.

Conventional heat-dissipating devices are designed for specific heat-generating elements. For those with lower working frequencies, the heat generated by them can be controlled to an extent that only heat-dissipating fins are sufficient. FIG. 1 is a side view of the conventional heat-dissipating device. As shown in the drawing, there are many heat-dissipating fins 13 with a high coefficient of thermal conduction tightly attached to the heat-dissipating elements 12 on the printed circuit board (PCB) 11. This increases the contact area between the heat-generating elements and air. Through natural convection, the heat-dissipating fins 13 with a high coefficient of thermal conduction dissipate heat produced by the heat-generating elements 12 into cold air.

However, many electronic products nowadays are designed to be more compact, have more functions, and run at higher frequencies. In particular, the industrial computer is more compact in size than office or home computers due to its working environment.

Therefore, the above-mentioned heat-dissipating device has to be improved in order to satisfy the above-mentioned requirements. FIG. 2 is a three-dimensional view of the heat-dissipating device for the industrial computer in the prior art. FIG. 3 is a three-dimensional exploded view of the heat-dissipating device in FIG. 2.

The industrial computer 20 includes a heat-dissipating housing 21, a heat-conducting block 22, and a motherboard 23. The heat-dissipating housing 21 is the aluminum extrusion type. Its outer surface is extended outwards into a plurality of heat-dissipating fins 231 in the horizontal or vertical direction. The purpose is to increase the contact area between the heat-dissipating housing 21 and the ambient air. The front and back of the heat-dissipating housing 21 can be fixed onto a front cover 212 and a back cover 213 through a fixing element 211. The inner side of the heat-dissipating housing 21 is in touch with the heat-dissipating block 22. The other end of the heat-dissipating block 22 is in touch with the heat-dissipating element 24 on the motherboard 23. The shape of the heat-dissipating block 22 can be the same as several electronic elements whose heat needs to be dissipated.

When the heat-dissipating elements 24 operate and generate heat, the heat is transferred by the heat-dissipating block 22 to the heat-dissipating housing 21. Through natural convection, the heat-dissipating fins 231 on the surface of the heat-dissipating housing 21 dissipate the heat of the heat-generating elements 24 into air.

For the heat-dissipating structure in the prior art, the heat-dissipating housing 21, the heat-dissipating block 22, and the motherboard 23 have to be fixed, respectively. Each fixing renders an assembly tolerance. The more assembly steps there are, the larger the accumulated assembly tolerance becomes. In the prior art, there are four tolerances in the assembly. The resulting total tolerance will affect the connections between elements. This generally leads to a lower heat-dissipating efficiency in industrial computers.

Moreover, this kind of heat-dissipating devices dissipates heat with the heat-dissipating block 22 attached on the heat-generating elements 24. To achieve the expected efficiency, the heat-dissipating block 22 has to occupy a certain space. Therefore, they may not be suitable for all industrial computers, particularly those using the expansion board architecture. Such industrial computers can expand their functions by inserting expansion boards at any time according to user's need.

For industrial computers using this expansion board architecture, there is a limited space between the motherboard and the expansion board. In the prior art, some space is required in order for the heat-dissipating structure to touch the heat-generating elements. This is not suitable for the expansion board architecture. If the heat-generating elements are right between the motherboard and the expansion board, the heat generated by the heat-generating elements cannot be effectively dissipated using the existing heat-dissipating devices. It is therefore necessary to provide a new heat-dissipating structure. In addition to satisfying the limit in space, it has to be able to effectively dissipate the heat generated by the heat-generating elements on the motherboard or the expansion board.

In summary, the prior art has had the problem that the heat-dissipating structure occupies larger space and cannot be conveniently used in the expansion board architecture to remove heat produced by the heat-generating elements between the motherboard and the expansion board. Moreover, it is likely to have an assembly tolerance. Consequently, it is imperative to solve these problems using improved techniques.

SUMMARY OF THE INVENTION

In view of the foregoing, the invention discloses a heat-dissipating structure for the expansion board architecture. The expansion board architecture includes a motherboard and a first expansion board. The motherboard has at least a first expansion slot. The first expansion board has at least a first expansion bus. The first expansion bus is electrically connected with the first expansion slot. The surfaces of the motherboard and the first expansion board that face each other have at least one heat-generating element. The disclosed heat-dissipating structure includes a heat-absorbing substrate and at least one heat-dissipating board.

The heat-absorbing substrate is provided with at least one fixing element using which the motherboard and the first expansion board are fixed thereon. Moreover, the heat-generating element is attached to the heat-absorbing surface of the heat-absorbing substrate. The heat-dissipating board extends from the heat-absorbing substrate. Besides, several heat-dissipating fins extend from heat-dissipating board.

The differences between the disclosed structure and the prior art are the following. The fixing element on the heat-absorbing substrate directly fixes the motherboard and the first expansion board thereon. The heat-generating element on either the motherboard or the first expansion board is right in touch with the heat-absorbing surface of the heat-absorbing substrate. The heat-absorbing substrate directly absorbs the heat produced by the heat-generating element, and transfers the heat to the heat-dissipating boards on the sides. The heat is then removed from the heat-dissipating fins on the heat-dissipating board extended from the heat-absorbing substrate by natural convection. This structure saves the space occupied by the heat-dissipating substrate and heat-dissipating board in the expansion board architecture. Since the motherboard and the first expansion board are fixed onto the heat-absorbing substrate in one assembly step, it reduces the assembly tolerance accumulated in multiple assembly steps. The heat produced by the heat-generating elements between the motherboard and the expansion board can thus be removed.

In summary, using the disclosed technical means, the invention achieves the goals of reducing space occupied by the heat-dissipating device, reducing the assembly tolerance, and effectively removing heat in the expansion board architecture.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
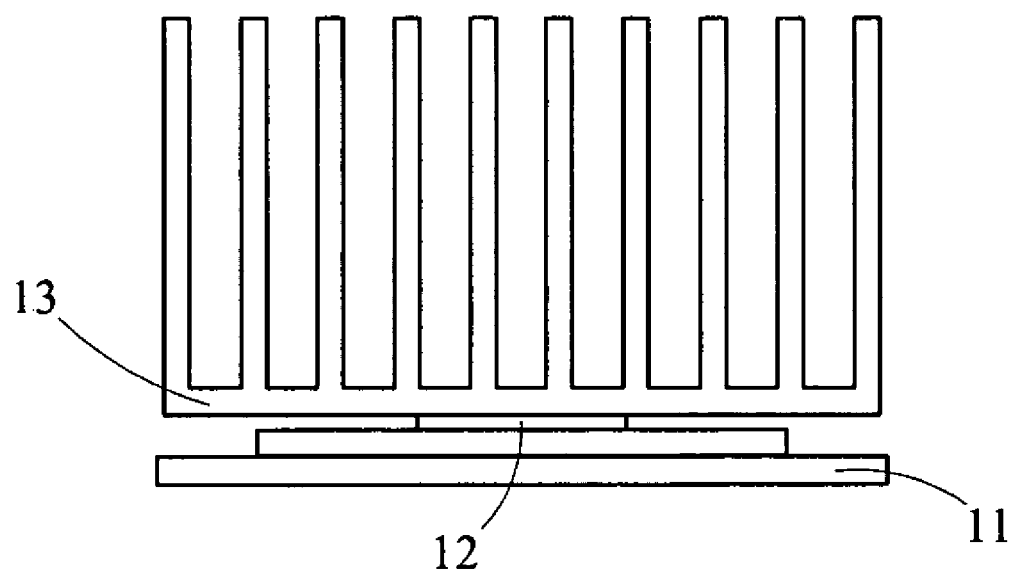
FIG. 1 is a side view of the conventional heat-dissipating device.
Figure 2:
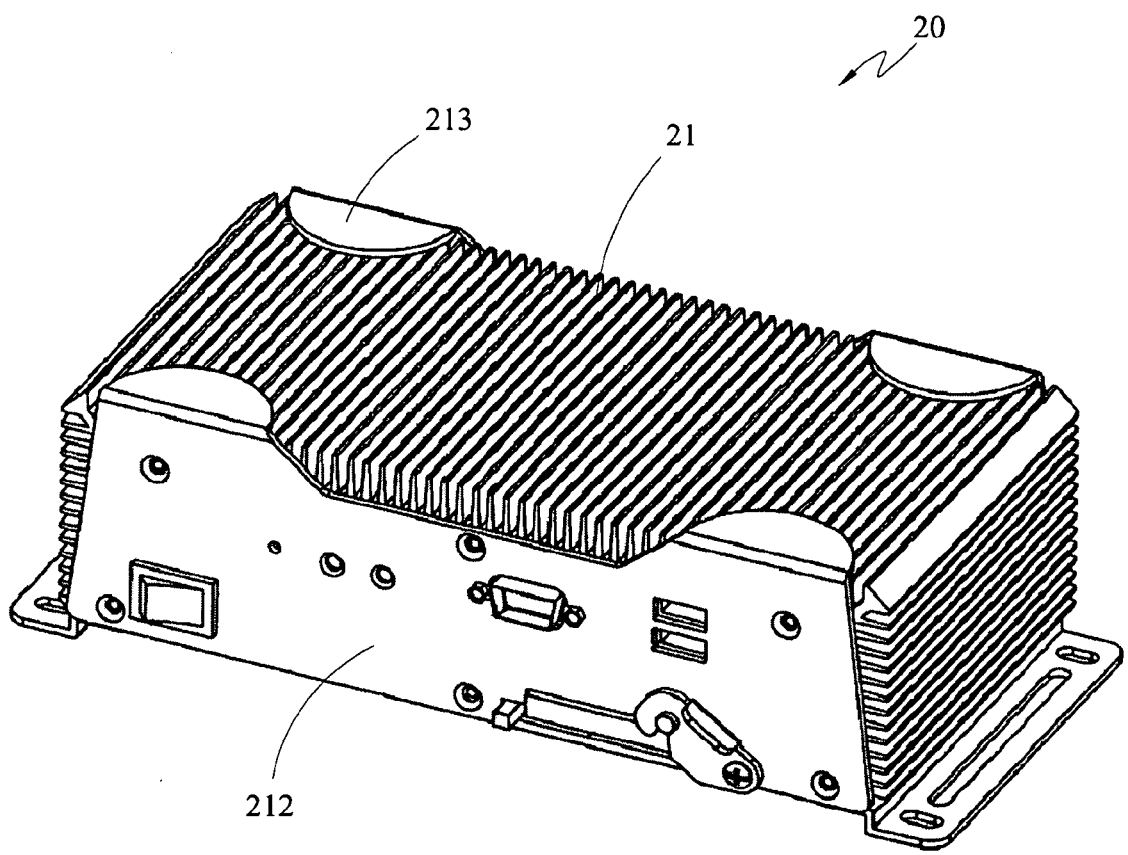
FIG. 2 is a three-dimensional assembly view of heat dissipation for the industrial computer in the prior art.
Figure 3:
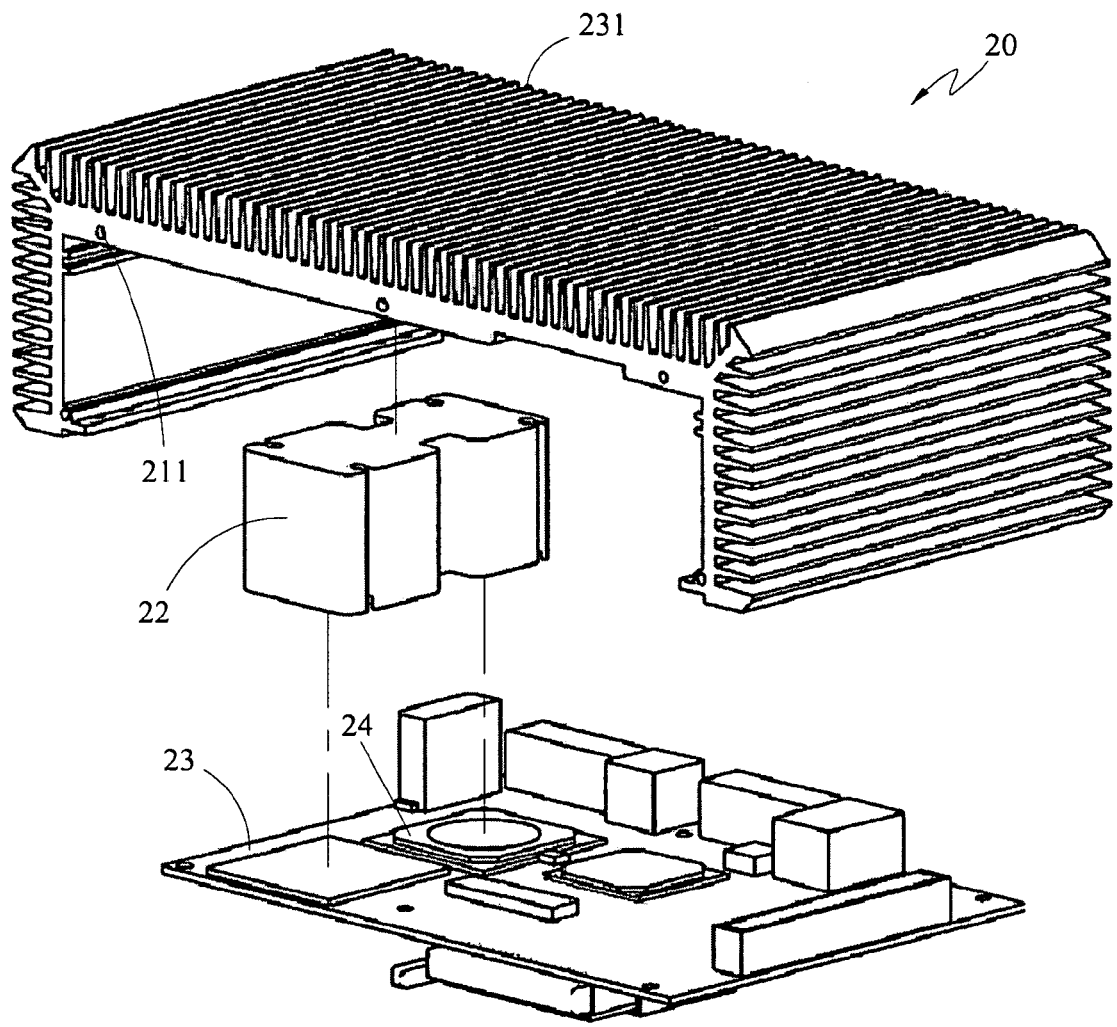
FIG. 3 is a three-dimensional exploded view of heat dissipation for the industrial computer in the prior art.
Figure 4:
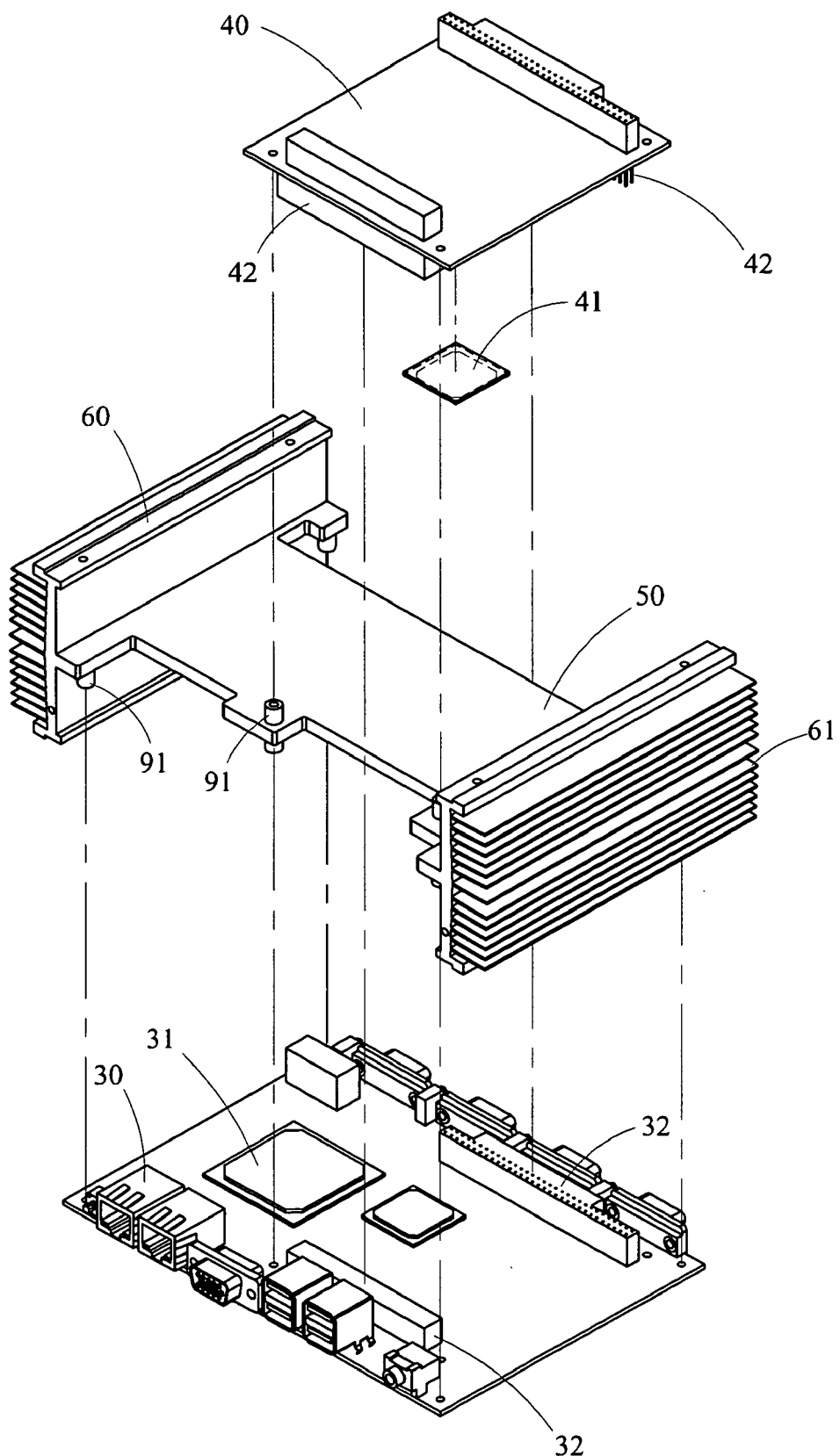
FIG. 4 is a three-dimensional exploded view of the disclosed heat-dissipating structure for the expansion board architecture.
Figure 5:
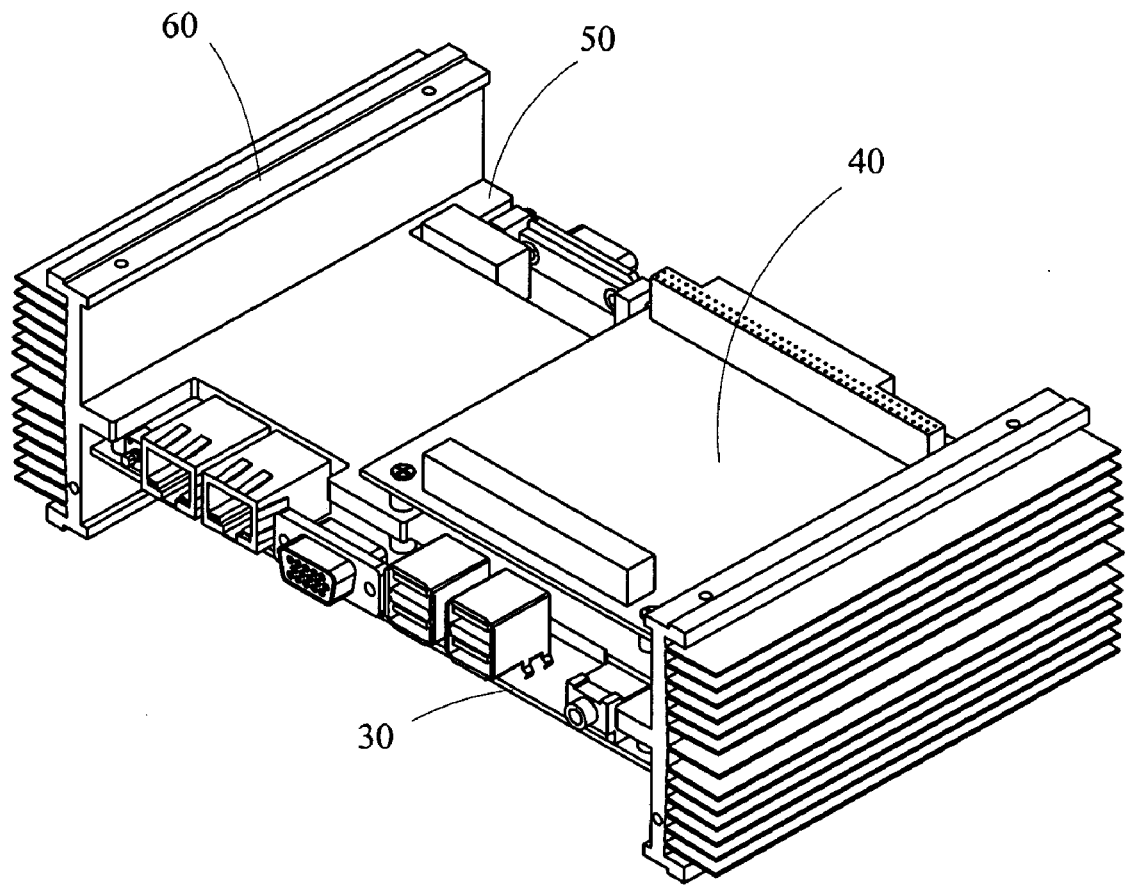
FIG. 5 is a three-dimensional assembly view of the disclosed heat-dissipating structure for the expansion board architecture.

We first describe the disclosed heat-dissipating structure for the expansion board architecture using FIGS. 4 and 5. FIG. 4 is a three-dimensional exploded view of the heat-dissipating structure for the expansion board architecture according to the invention. FIG. 5 is a three-dimensional assembly view of the disclosed heat-dissipating structure for the expansion board architecture.

In the invention, the expansion board architecture includes a motherboard 30 and a first expansion board 40. The motherboard 30 has at least a first expansion slot 32. The first expansion board 40 has at least a first expansion bus 42. The first expansion bus 42 is electrically connected with the first expansion slot 32. The surfaces of the motherboard 30 and the first expansion board 40 that face each other have at least one heat-generating element. The disclosed heat-dissipating structure includes a heat-absorbing substrate 50 and at least one heat-dissipating board 60.

The heat-absorbing substrate 50 is provided with at least one fixing element 91 using which the motherboard 30 and the first expansion board 40 are fixed thereon. Moreover, the heat-generating element disposed on the motherboard 30 is defined as the first heat-generating element 31. The heat-generating element disposed on the first expansion board 40 is defined as the second heat-generating element 41. The heat-absorbing surface of the heat-absorbing substrate 50 for the first heat-generating element 31 to attach is defined as the first heat-absorbing surface 51. The heat-absorbing surface of the heat-absorbing substrate 50 for the second heat-generating element 41 to attach is defined as the second heat-absorbing surface 52.

The heat-dissipating board 60 extends from the heat-absorbing substrate 50. Besides, several heat-dissipating fins 61 extend from heat-dissipating board 60. The assembly view of the above-mentioned elements is shown in FIG. 5.

The expansion board architecture referred herein includes the basic functions of the motherboard 30. In addition, the first expansion board 40 is inserted into the first expansion slot 32 on the motherboard 30 via the first expansion bus 42, forming a stack structure. The first expansion board 40 is stacked above or below the motherboard 30.

Usually, the electronic elements on the first expansion board 40 are designed not to produce too much heat that natural convection cannot take away. However, the rapid growth in packaging techniques, electronic elements no the first expansion board 40 nowadays also produce a lot of heat that cannot be removed by natural convection directly.

Therefore, the first heat-generating element 31 and the first expansion slot 32 on the motherboard 30 are disposed on the same surface thereof. The second heat-generating element 41 and the first expansion bus 42 are disposed on the same surface thereof. Therefore, when the motherboard 30 and the first expansion board 40 together form the expansion board structure, the first heat-generating element 31 and the second heat-generating element 41 are in the same direction.

To solve the heat-dissipating problem in the above-mentioned expansion board architecture, the invention puts a heat-absorbing substrate 50 between the motherboard 30 and the first expansion board 40. The heat-absorbing substrate 50 has at least one fixing element 91 to fix the motherboard 30 and the first expansion board 40 thereon directly. Since the first heat-generating element 31 and the second heat-generating element 41 are in the same direction, the first heat-generating element 31 on the motherboard 30 can be attached to the first heat-absorbing surface 51 of the heat-absorbing substrate 50, and the second heat-generating element 41 on the first expansion board 40 to the second heat-absorbing surface 52 of the heat-absorbing substrate 50. Through the first heat-absorbing surface 51 and the second heat-absorbing surface 52 of the heat-absorbing substrate 50, the heat produced by the first heat-generating element 31 and the second heat-generating element 41 can be simultaneously removed. Moreover, the motherboard 30, the first expansion board 40, and the heat-absorbing substrate 50 are assembled all at once. Thus, the accumulated assembly tolerance can be largely reduced.

Using at least one heat-dissipating board 60 extended from the heat-absorbing substrate 50 and the heat-dissipating fins 61 thereon, the heat absorbed from the first heat-generating element 31 and the second heat-generating element 41 can be dissipated into the environment by natural convection and thermal radiation. The heat generated by the first heat-generating element 31 and the second heat-generating element 41 can then be removed.

Figure 6A:
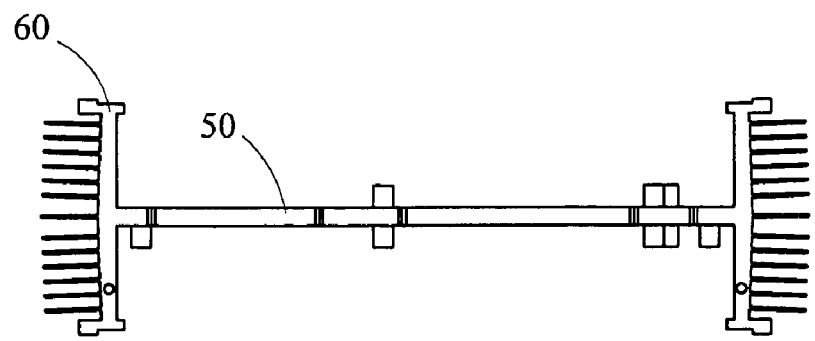
FIG. 6A is a side view of the disclosed heat-dissipating structure with an H shape.
Figure 6B:
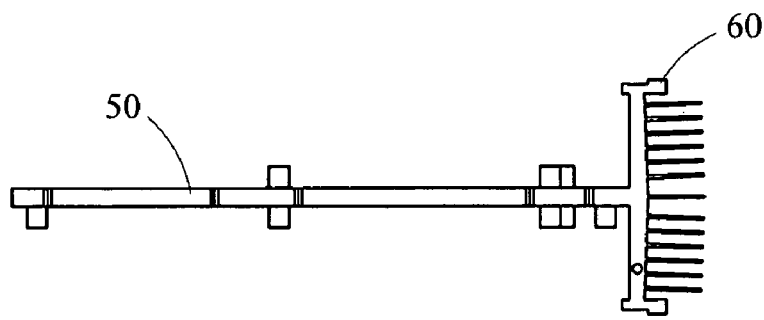
FIG. 6B is a side view of the disclosed heat-dissipating structure with a T shape in a first embodiment.
Figure 6C:
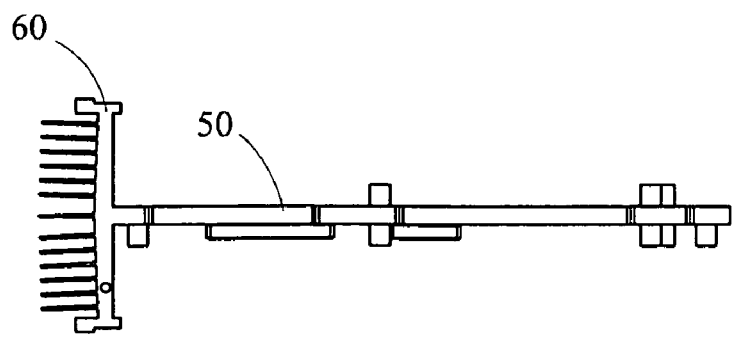
FIG. 6C is a side view of the disclosed heat-dissipating structure with a T shape in a second embodiment.

The heat-dissipating board 60 can be on one side of the heat-absorbing substrate 50 or on opposite sides thereof, forming either a T shape or an H shape (as shown in FIGS. 6A, 6B, and 6C).

The heat-dissipating board 60 can be extended with the heat-absorbing substrate 50 as the center, so that the heat-absorbing substrate 50 is connected to the central position of the heat-dissipating board 60. In this case, the distances from the heat-absorbing substrate 50 to the two edges of the heat-dissipating board 60 are the same. This renders a uniform distribution of temperature on the heat-dissipating board 60. Because of that, the heat-dissipating efficiency on both edges of the heat-dissipating board 60 is the same. This can effectively prevent inhomogeneous heat dissipation due to the temperature difference on the upper and lower sides of the heat-dissipating board 60. The heat-dissipating efficiency of the heat-dissipating board 60 is also enhanced.

The disclosed heat-dissipating structure for the expansion board architecture uses the heat-absorbing substrate 50 and the heat-dissipating board 60 to dissipate heat. Since the heat-absorbing substrate 50 is disposed between the motherboard 30 and the first expansion board 40, the space occupied by the heat-absorbing substrate 50 is very restricted. At the same time, the heat-dissipating board 60 extended from one side of the heat-absorbing substrate 50 can dissipate the heat absorbed by the heat-absorbing substrate 50. This effectively reduces the space occupied by the heat-absorbing substrate 50 if it is directly attached to the heat-generating elements. Therefore, it can simultaneously reduce the space occupied by the heat-dissipating structure and achieve the same heat dissipation effect.

Figure 7A:
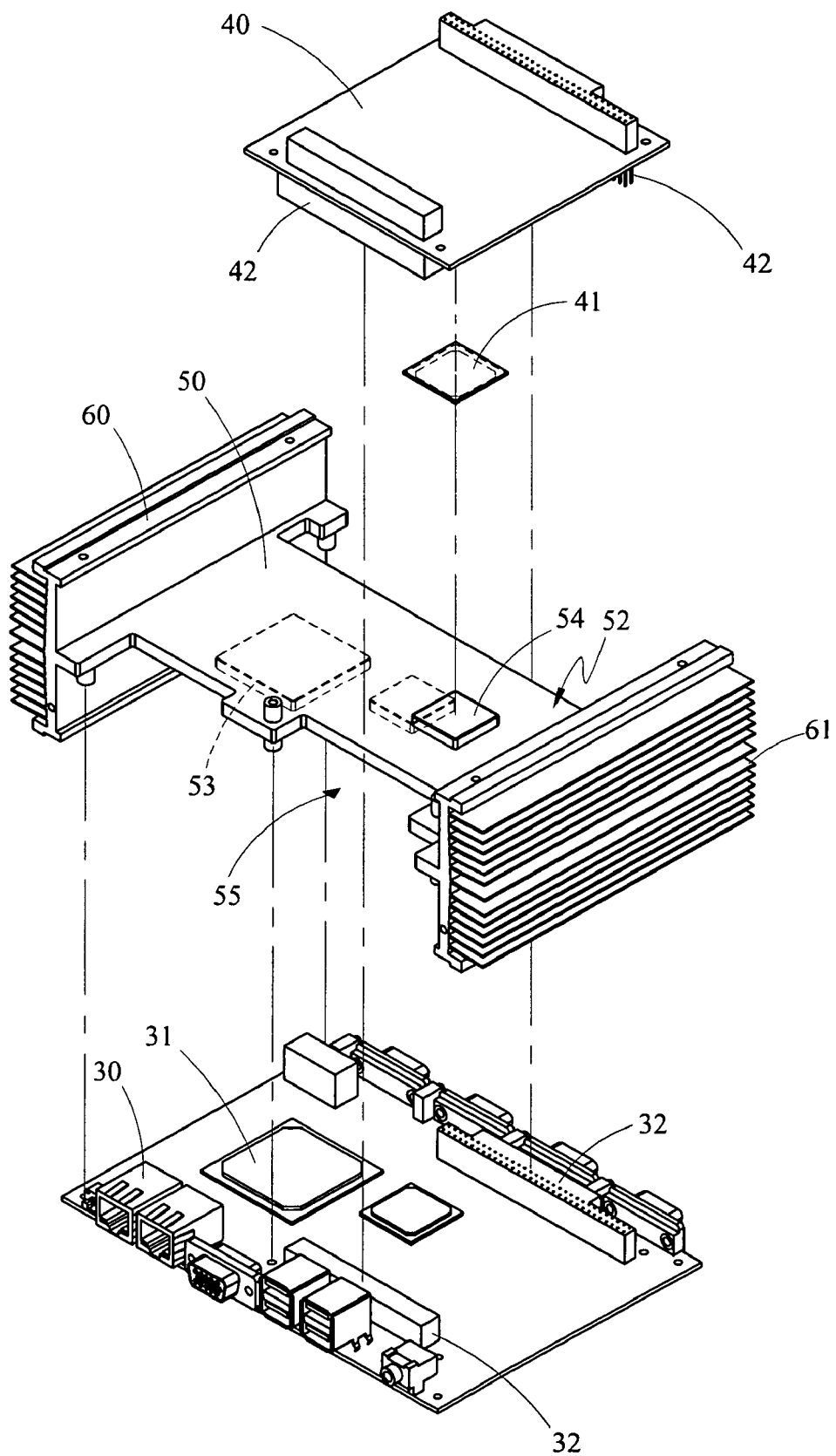
FIG. 7A is a three-dimensional view of the disclosed heat-dissipating structure for the expansion board architecture.
Figure 7B:
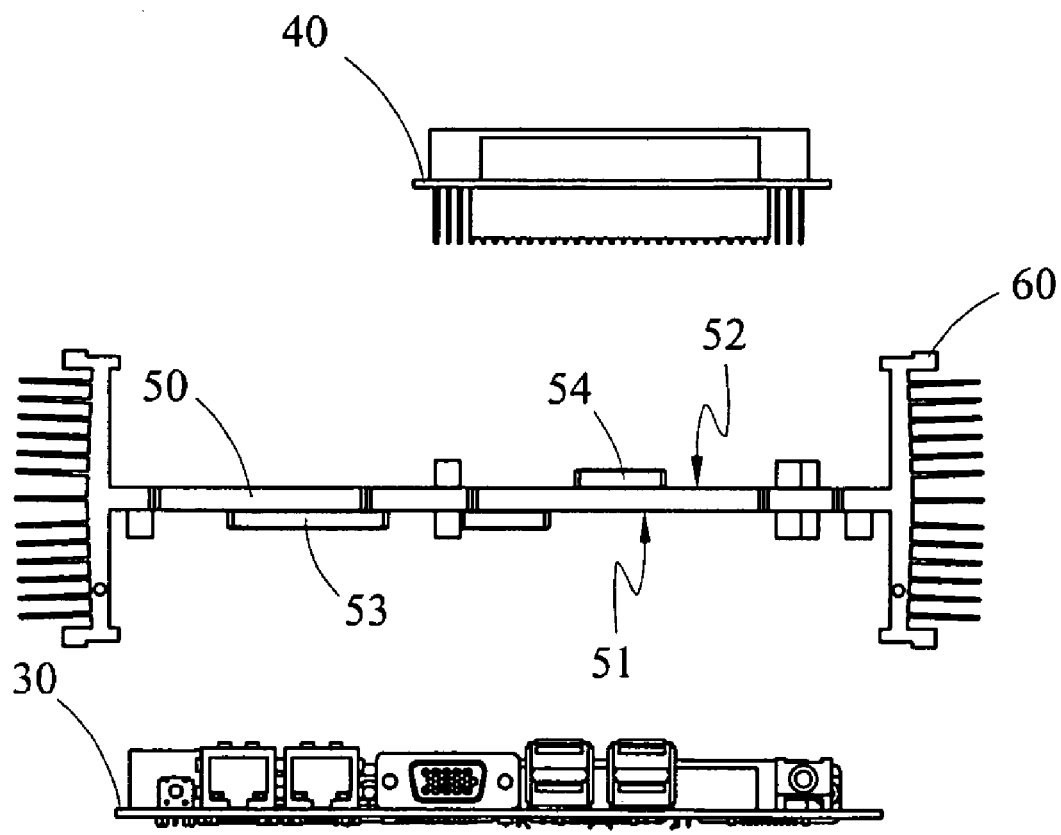
FIG. 7B is a side view of the disclosed heat-dissipating structure for the expansion board architecture.

Please refer to FIGS. 7A and 7B. FIG. 7A is a three-dimensional view of the disclosed heat-dissipating structure for the expansion board architecture. FIG. 7B is a side view of FIG. 7A.

For different motherboards 30 and first expansion boards 40, there may be some tiny difference in the height of the heat-generating elements. This directly prevents the first heat-generating element 31 on the motherboard 30 and the second heat-generating element 41 on the first expansion board 40 from tightly attaching to the heat-absorbing substrate 50.

To prevent the above-mentioned problems, the first heat-absorbing surface 51 and the second heat-absorbing surface 52 of the heat-absorbing substrate 50 can further include at least one first heat-absorbing part 53 and at least one second heat-absorbing part 54, respectively. In this case, the first heat-absorbing part 53 and the second heat-absorbing part 54 can be directly attached to the first heat-generating element 31 on the motherboard 30 and the second heat-generating element 41 on the first expansion board 40, respectively. Through the first heat-absorbing part 53 and the second heat-absorbing part 54, the heat produced by the first heat-generating element 31 and the second heat-generating element 41 is absorbed and transferred to the heat-absorbing substrate 50.

In addition to preventing the problem that the first heat-generating element 31 on the motherboard 30 and the second heat-generating element 41 on the first expansion board 40 cannot be attached to the heat-absorbing substrate 50, the first heat-absorbing part 53 and the second heat-absorbing part 54 also increase the heat-absorbing volume and thus the heat capacity. Besides, the first heat-absorbing part 53 and the second heat-absorbing part 54 on the heat-absorbing substrate 50 can be used to reduce the structural tolerance when the motherboard 30 and the first expansion board 40 are connected to the heat-absorbing substrate 50.

For different motherboards 30 and first expansion boards 40, there may be some tiny difference in the height of the heat-generating elements. Electronic elements with larger heights, such as capacitors, I/O interfaces, etc, can directly prevent the first heat-generating element 31 on the motherboard 30 and the second heat-generating element 41 on the first expansion board 40 from tightly attaching to the heat-absorbing substrate 50.

In this case, the heat-absorbing substrate 50 has to be specially designed such that there is at least one electronic element recess 55 or at least one electronic element hole (not shown). Then electronic elements with larger heights or I/O interfaces can go through the heat-absorbing substrate 50. As a result, the first heat-generating element 31 on the motherboard 30 and the second heat-generating element 41 on the first expansion board 40 can be attached.

Figure 8:
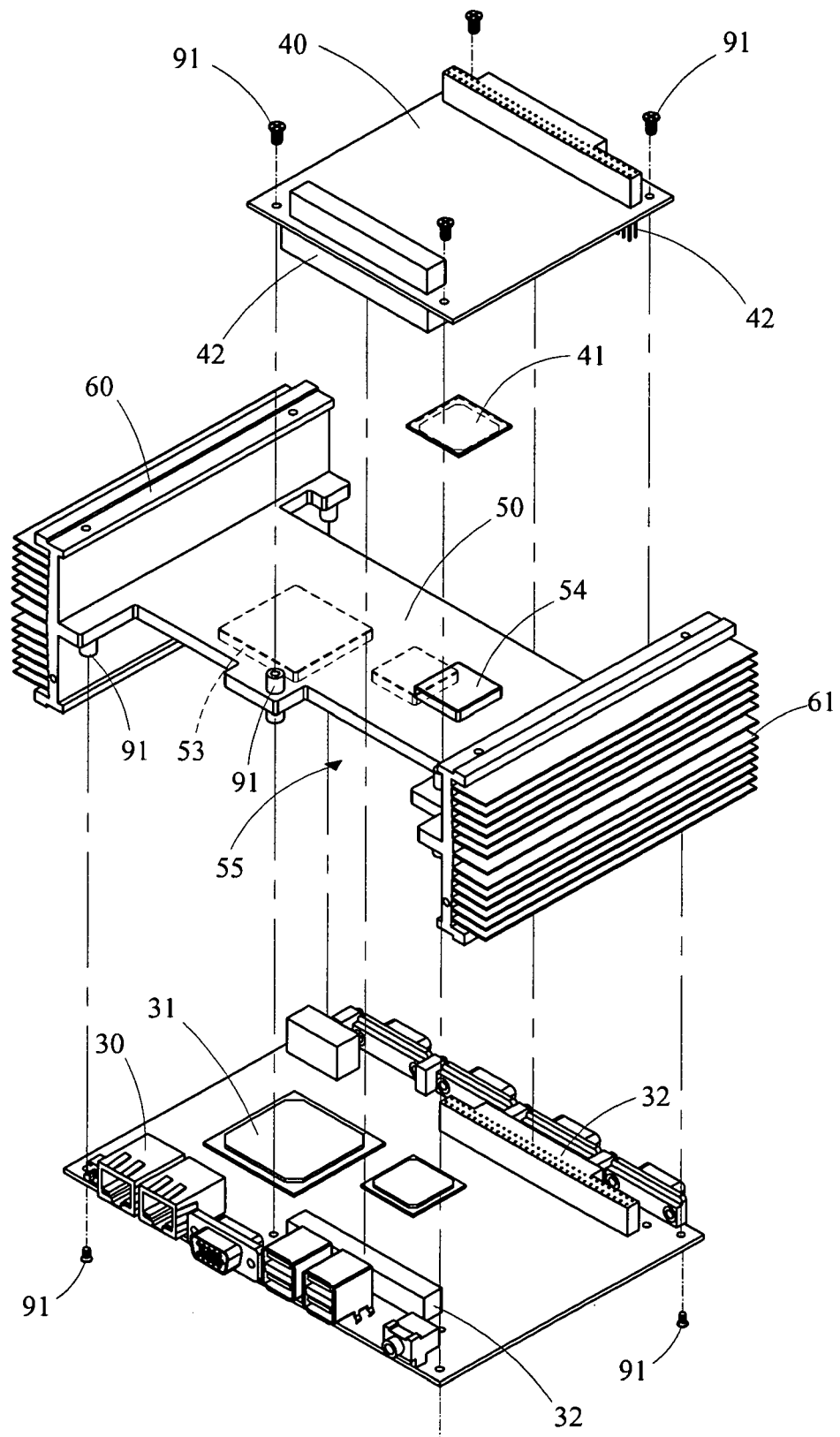
FIG. 8 is a three-dimensional view of the disclosed heat-dissipating structure for the expansion board architecture.

Please refer to FIG. 8, which is a three-dimensional view of the disclosed heat-dissipating structure for the expansion board architecture. The heat-absorbing substrate 50 has at least one fixing element 91 to fix the motherboard 30 and the first expansion board 40 or the heat-absorbing substrate 50 and the first expansion board 40. The relative positions of first heat-generating element 31, the second heat-generating element 41, the first heat-absorbing part 53, the second heat-absorbing part 54, and the electronic element recess 55 or the electronic element hole are thus fixed.

The fixing element 91 on the heat-absorbing substrate 50 can be one with a pin thread, and the fixing element 91 on the motherboard 30 or the first expansion board 40 can be one with a box thread. Through the pin thread and the box thread, the heat-absorbing substrate 50 and the motherboard 30 or the first expansion board 40 are fixed to each other. However, the invention is not restricted to this example. Other existing techniques, such as buckling, locking, and screwing can be used as well. The fixing element 91 in the following embodiments is the same as here. Therefore, the fixing scheme is not repeated hereinafter.

Figure 9A:
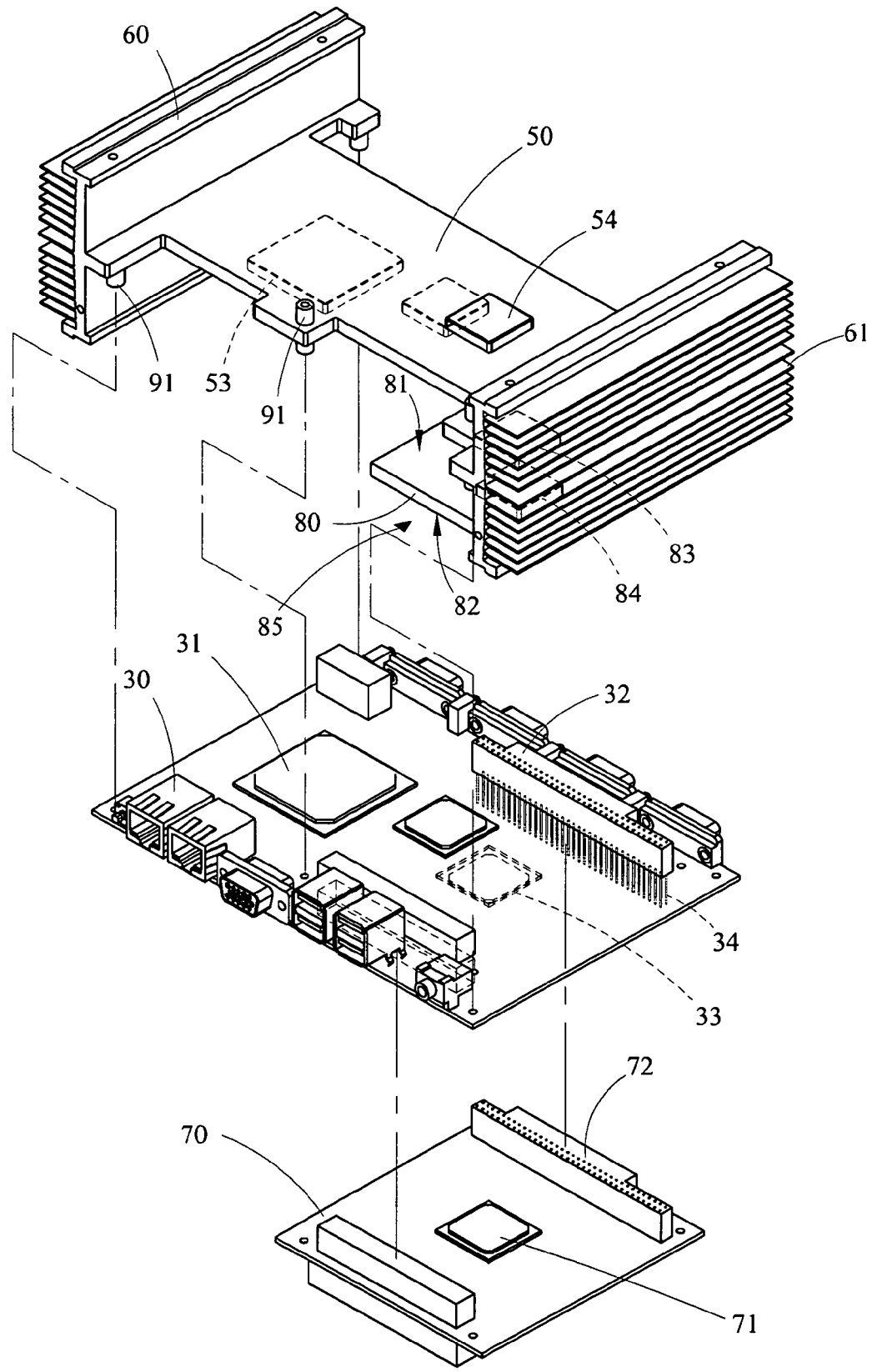
FIG. 9A is a three-dimensional view of the disclosed mother board, heat-dissipating substrate, and second expansion board.

The above has described the basic elements in the disclosed heat-dissipating structure for the expansion board architecture. Afterwards, please refer to FIGS. 9A and 9B. FIG. 9A is a three-dimensional view of the structure with a motherboard, a heat-dissipating substrate, and a second expansion board.

Figure 9B:
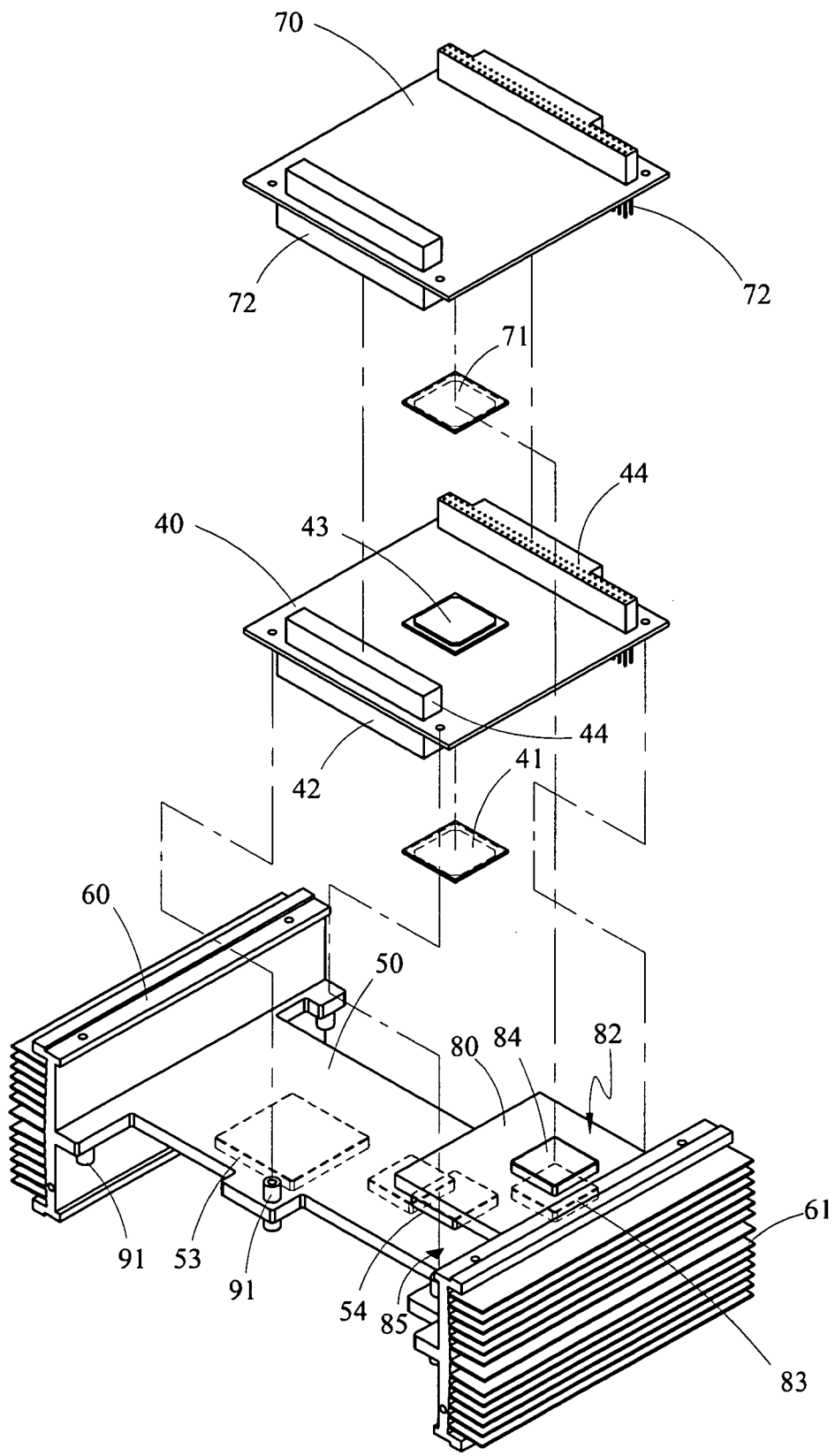
FIG. 9B is a three-dimensional view of the disclosed first expansion board, heat-dissipating substrate, and second expansion board.

FIG. 9B is a three-dimensional view of the structure with a first expansion board, a heat-dissipating substrate, and a second expansion board.

In addition to the basic stack structure of the motherboard 30, the first expansion board 40, and the heat-absorbing substrate 50, the surface of the motherboard 30 opposite to the first expansion board 40 or the surface of the first expansion board opposite to the motherboard can further include at least one third heat-generating element 33 and at least one second expansion slot 34 or one fourth heat-generating element 43 and at least one third expansion slot 44.

The third heat-generating element 33 and the second expansion slot 34 are disposed on the other surface of the motherboard 30. The fourth heat-generating element 43 and the third expansion slot 44 are disposed on the other surface of the first expansion board 40.

The invention also includes a second expansion board 70 having at least one fifth heat-generating element 71 and at least one second expansion bus 72. The fifth heat-generating element 71 and the second expansion bus 72 are disposed on the same surface of the second expansion board 70. The second expansion board 70 is inserted into the second expansion slot 34 of the motherboard 30 via the second expansion bus 72 or, alternatively, inserted into the third expansion slot 44 of the first expansion board 40 via the second expansion bus 72, forming an electrical connected with the motherboard 40 or the first expansion board 40.

The motherboard 30, the first expansion board 40, and the second expansion board 70 are stacked together, making the expansion board structure expandable. The third heat-generating element 33 and the second expansion slot 34 on the motherboard 30 are disposed on the other surface thereof. The fourth heat-generating element 43 and the third expansion slot 44 on the first expansion board are disposed on the other surface thereof. Therefore, when the motherboard 30 and the second expansion board 70 or the first expansion board 40 and the second expansion board 70 form a expansion board structure, the third heat-generating element 33 and the fifth heat-generating element 71 are in the same direction or the fourth heat-generating element 43 and the fifth heat-generating element 71 are in the same direction.

To solve the heat-dissipating problem in the above-mentioned expandable expansion board architecture, the invention puts a heat-absorbing board 80 between the motherboard 30 and the second expansion board 70 or between the first expansion board 40 and the second expansion board 70. Since the third heat-generating element 33 and the fifth heat-generating element 71 are in the same direction, the third heat-generating element 33 on the motherboard 30 can be attached to the first heat-absorbing surface 81 of the heat-absorbing board 80 and the fifth heat-generating element 71 on the second expansion board 70 to the second heat-absorbing surface 82 of the heat-absorbing board 80. Through the first heat-absorbing surface 81 and the second heat-absorbing surface 82, the heat produced by the third heat-generating element 33 and the fifth heat-generating element 71 can be simultaneously absorbed in the expansion board architecture.

Moreover, since the fourth heat-generating element 43 and the fifth heat-generating element 71 are in the same direction, the fourth heat-generating element 43 on the first expansion board 40 can be attached to the first heat-absorbing surface 81 of the heat-absorbing board 80, and the fifth heat-generating element 71 on the second expansion board 70 to the second heat-absorbing surface 82 of the heat-absorbing board 80. Through the first heat-absorbing surface 81 and the second heat-absorbing surface 82, the heat produced by the fourth heat-generating element 43 and the fifth heat-generating element 71 can be simultaneously absorbed in the expansion board architecture.

The heat-dissipating board 80 extends from the heat-dissipating board 60 along the direction between the motherboard 30 and the second expansion board 70 or along the direction between the first expansion board 40 and the second expansion board 70. The first heat-absorbing surface 81 and the second heat-absorbing surface 82 of the heat-absorbing board 80 can further include at least a third heat-absorbing part 83 and at least a fourth heat-absorbing part 84 to achieve the same effect as the first heat-absorbing part 53 and the second heat-absorbing part 54. Therefore, it is not repeated herein again.

Likewise, the heat-absorbing board 80 can also be designed to have at least one electronic element recess 85 or at least one electronic element hole. Their effects and purposes are the same as those of the electronic element recess 55 or electronic element hole (not shown) on the heat-absorbing substrate 50. Therefore, it is not repeated herein again.

Moreover, the heat-absorbing board 80 further includes at least one fixing element 91. The second expansion board 70 also includes at least one fixing element 91. The fixing elements 91 fix the heat-absorbing board 80 to the mother board 30, the heat-absorbing board 80 to the second expansion board 70, or the heat-absorbing board 80 to the first expansion board 40, so that the relative positions of the third heat-generating element 33, the fourth heat-generating element 43, the third heat-absorbing part 83, the fourth heat-absorbing part 84, and the electronic element recess 85 or the electronic element hole can be fixed.

Figure 10A:
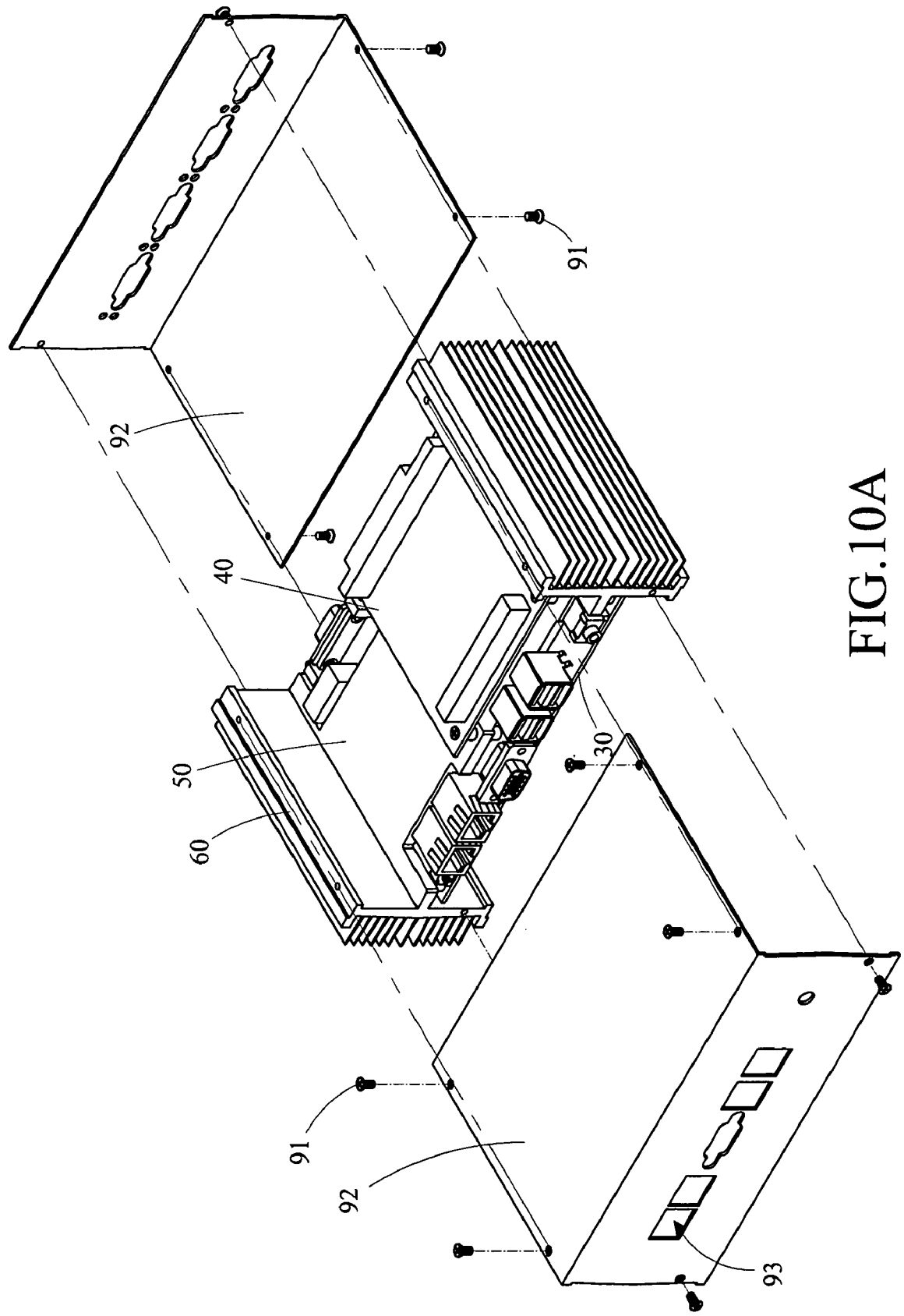
FIG. 10A is a three-dimensional exploded view of the industrial computer using the disclosed heat-dissipating structure for the expansion board architecture.
Figure 10B:
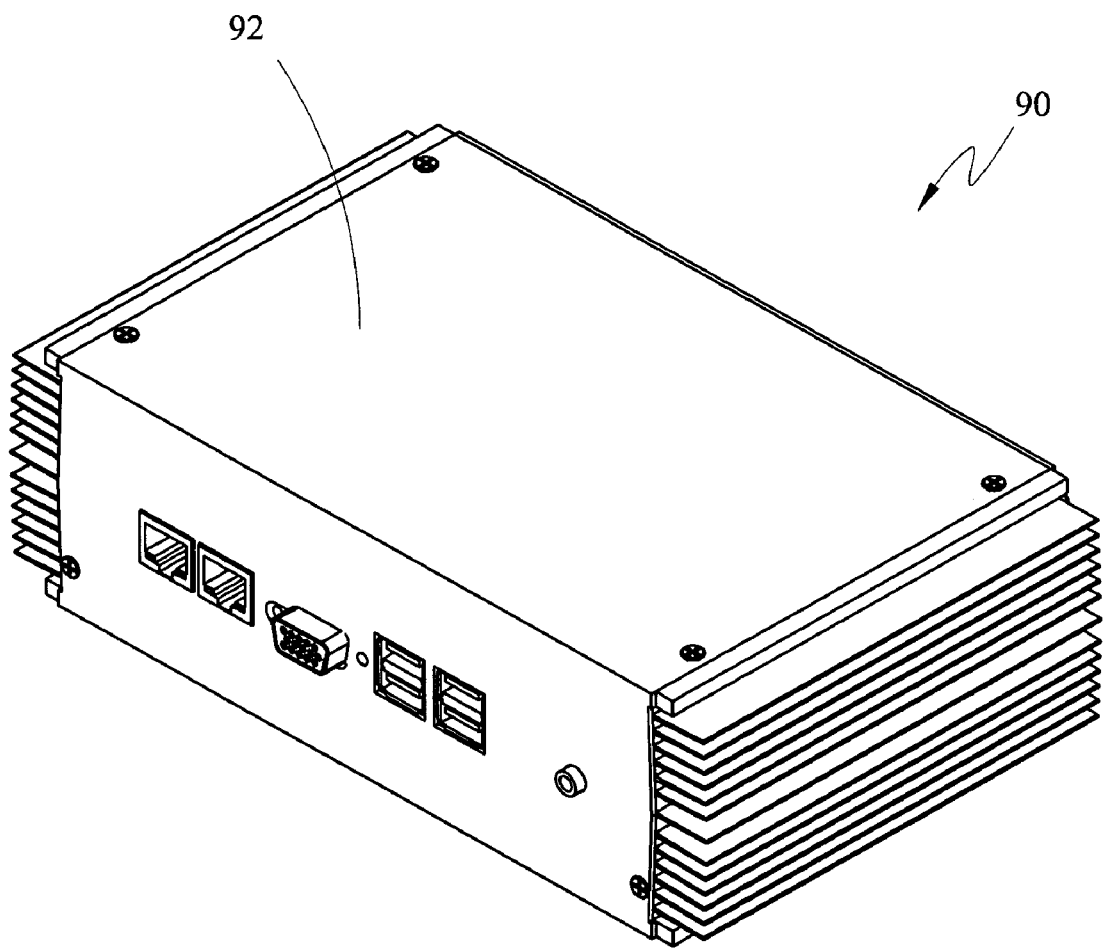
FIG. 10B is a three-dimensional assembly view of FIG. 10A.

Please refer to FIGS. 10A and 10B. FIG. 10A is a three-dimensional exploded view of the industrial computer using the disclosed heat-dissipating structure for the expansion board architecture. FIG. 10B is a three-dimensional assembly view of FIG. 10A.

An industrial computer 90 using the expansion board architecture can employ the disclosed heat-dissipating structure to dissipate heat on the motherboard 30 and the first expansion board 40. The housing 92 of the industrial computer 90 encloses the heat-dissipating structure of the expansion board architecture. The housing 92 is fixed to the heat-dissipating board 60 by the fixing element 91. Besides, the housing 92 of the industrial computer 90 further includes at least one hole 93 for the I/O interfaces on the motherboard 30. The housing 92 encloses the disclosed heat-dissipating structure and fixes the assembly. The three-dimensional assembled view of the industrial computer 90 is given in FIG. 10B.

Figure 11A:
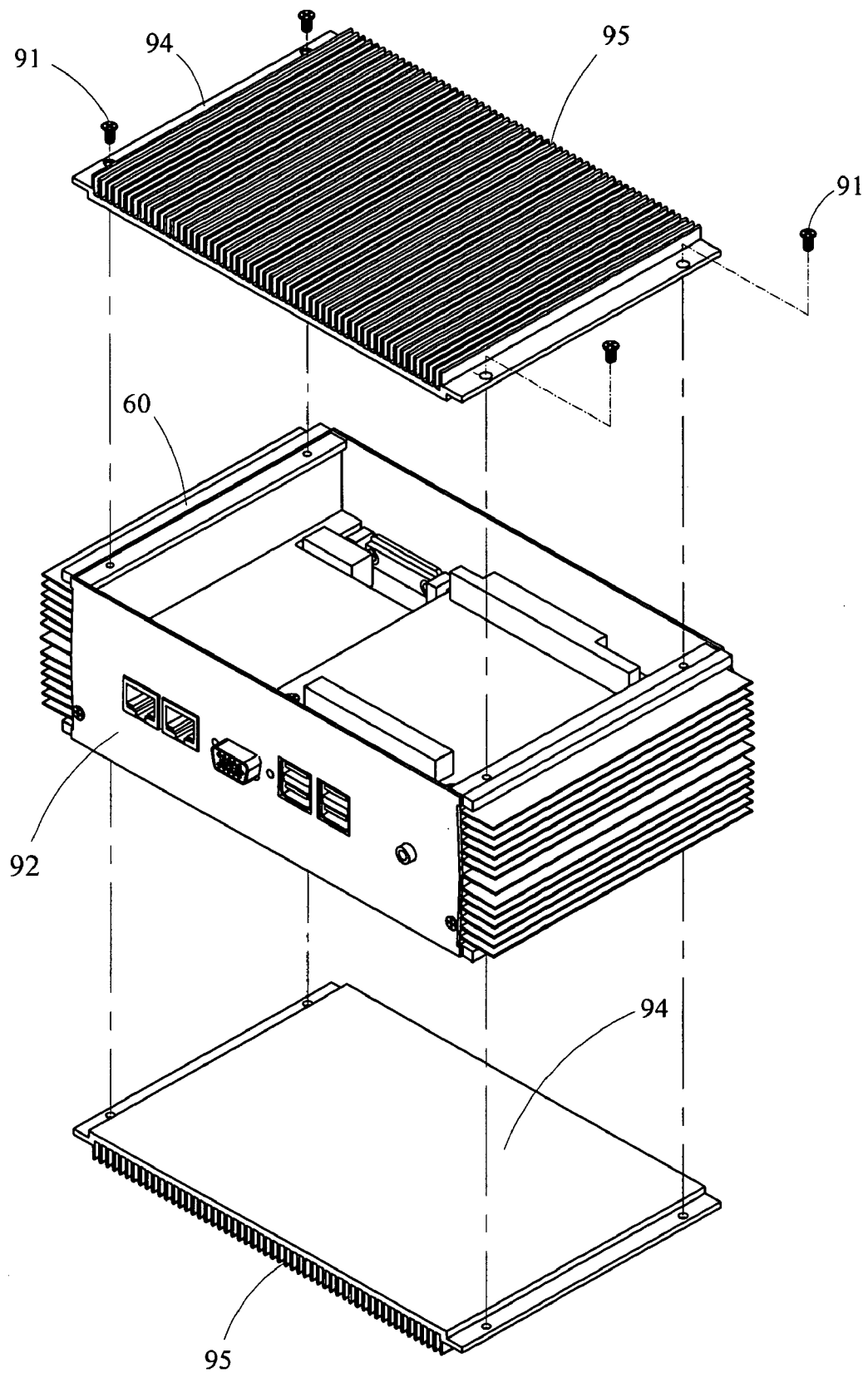
FIG. 11A is a three-dimensional exploded view of the heat-dissipating housing of the industrial computer using the invention.
Figure 11B:
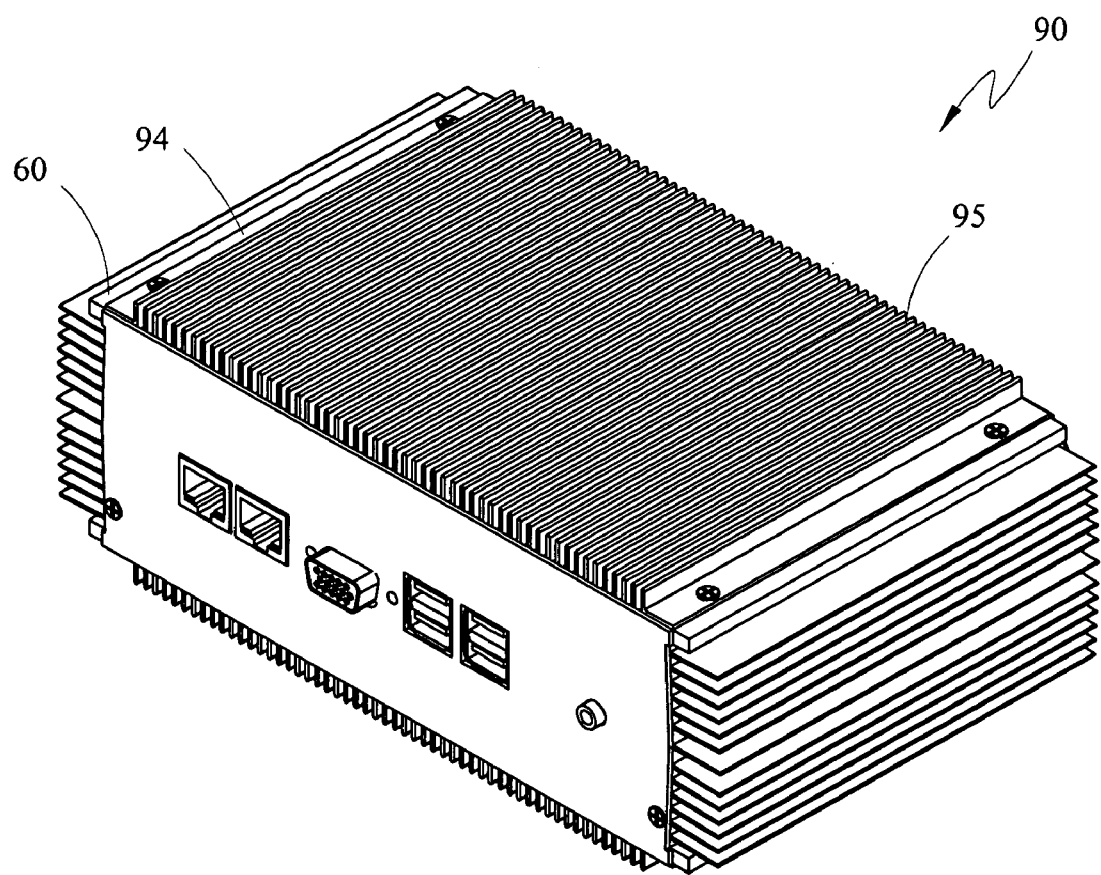
FIG. 11B is a three-dimensional assembly view of FIG. 11A.

Please refer to FIGS. 11A and 11B. FIG. 11A is a three-dimensional exploded view of the heat-dissipating housing of the industrial computer using the invention. FIG. 11B is a three-dimensional assembly view of FIG. 11A.

In addition to covering the disclosed heat-dissipating structure for the expansion board architecture using the housing 92 of the industrial computer 90, one may use a heat-dissipating housing 94 to replace the usual housing 92. The replaced housing 92 is a plane with the hole 93. The heat-dissipating housing 94 is further provided with a plurality of heat-dissipating fins 95. It can be fixed on the heat-dissipating board using the fixing element 91. This can increase the heat-dissipating area and efficiency.

Figure 12:
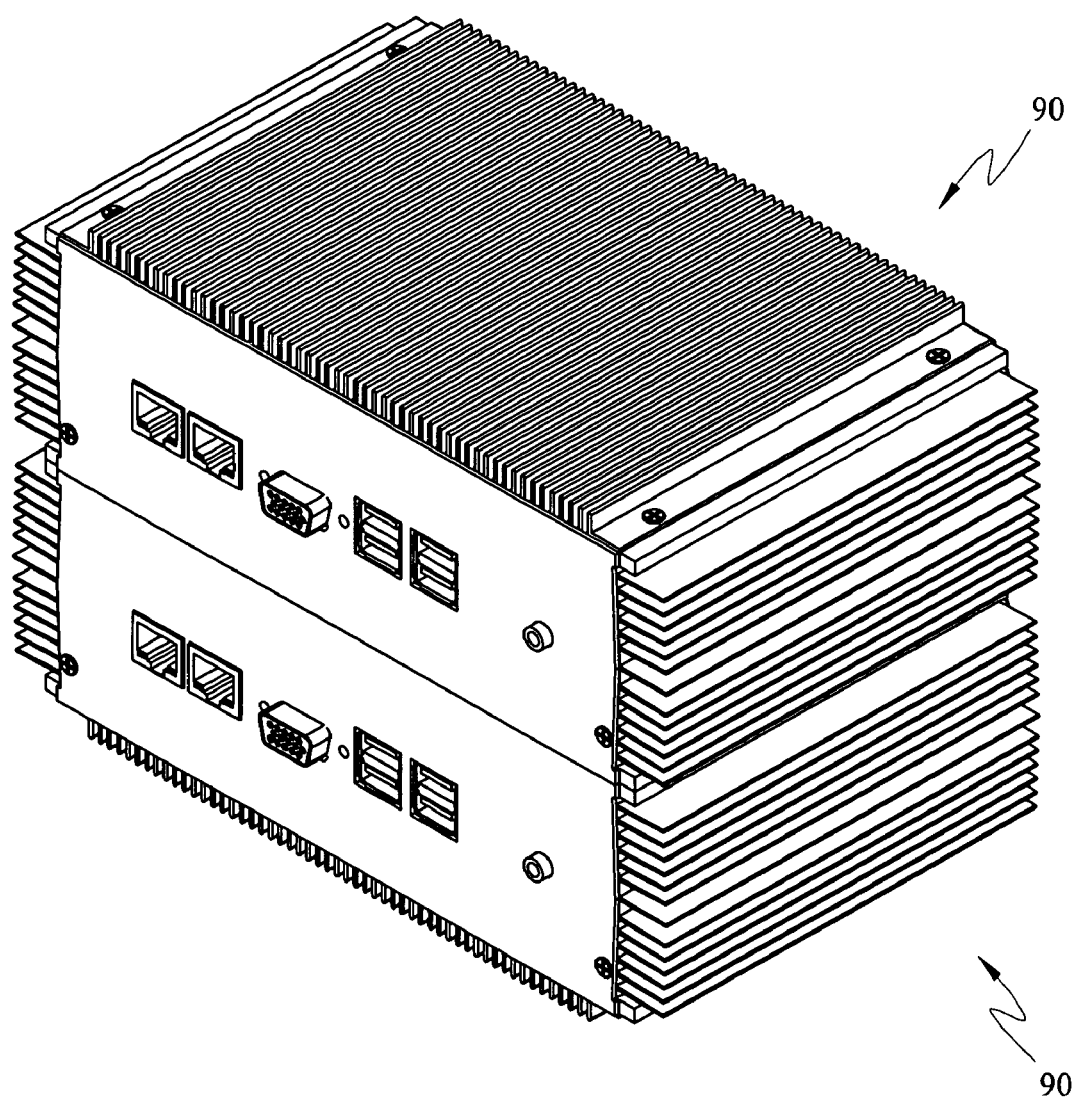
FIG. 12 is a three-dimensional view of stacking up the industrial computer using the invention.

Finally, in addition to increasing the expansion boards in the expansion board architecture, the invention can stack different industrial computers 90 that employ the disclosed heat-dissipating structure for the expansion board architecture. Please refer to FIG. 12, which is a three-dimensional view showing that two industrial computers using the invention are stacked together.

On the upper and lower sides of the heat-dissipating board 60, the fixing element 91 can be used to stack different industrial computers 90 that employ the disclosed heat-dissipating structure for the expansion board architecture. This stacking can be continued. The stacked result of industrial computers 90 that employ the disclosed heat-dissipating structure is illustrated I FIG. 12.

In summary, the invention is different from the prior art in the following aspects. First, it uses the fixing element provided on the heat-absorbing substrate to directly fix the motherboard and the first expansion board thereon. The heat-generating elements disposed on the motherboard or the first expansion board can be attached on the heat-absorbing surface of the heat-absorbing substrate. The heat-absorbing substrate directly absorbs the heat produced by the heat-generating elements and transfers the heat to the heat-dissipating board on the sides. Through natural convection of the heat-dissipating fins on the heat-dissipating board extended from the heat-absorbing substrate, heat absorbed by the heat-absorbing substrate is released to the environment. The expansion board architecture can thus reduce its heat-dissipating space using the heat-absorbing substrate and the heat-dissipating board. Since the motherboard and the first expansion board are directly fixed onto the heat-dissipating substrate, this involves only one assembly, reducing accumulated assembly tolerance through multiple assembly steps. The heat produced by the heat-generating elements between the motherboard and the expansion board can be readily removed.

The disclosed techniques can solve the problem in the prior art that the existing heat-dissipating structure occupies so much space that it is not suitable for dissipating heat produced by the heat-generating elements between the motherboard and the expansion board. The invention also solves the problem of large assembly tolerance. In other words, the invention achieves the goals of reducing space occupied by the heat-dissipating device, minimizing the assembly tolerance, and dissipating heat in the expansion board architecture.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat-dissipating structure for the expansion board architecture including a motherboard with at least one first expansion slot and a first expansion board with at least one first expansion bus, the first expansion bus electrically connected with the first expansion slot, and at least one heat-generating element 24 being disposed on the one of surfaces between the motherboard and the first expansion board, the heat-dissipating structure comprising:
   a heat-absorbing substrate, which has at least one fixing element through which the motherboard and the first expansion board are fixed thereon and the at least one heat-generating element 24 is attached to a heat-absorbing surface of the heat-absorbing substrate; and
   at least one heat-dissipating board, which is extended from the heat-absorbing substrate and has a plurality of heat-dissipating fins thereon.

2. The heat-dissipating structure for the expansion board architecture of claim 1, wherein the heat-absorbing surface further includes at least one heat-absorbing part.

3. The heat-dissipating structure for the expansion board architecture of claim 1, wherein the heat-dissipating board is extended from one or both sides of the heat-absorbing substrate to form a T shape or an H shape, respectively.

4. The heat-dissipating structure for the expansion board architecture of claim 1, wherein the at least one heat-generating element 24 disposed on
   the surface of the motherboard facing the first expansion board is defined as a first heat-generating element 31 and the at least one heat-generating element 24 disposed on the surface of the first expansion board facing the motherboard is defined as a second heat-generating element 41.

5. The heat-dissipating structure for the expansion board architecture of claim 4, wherein the heat-absorbing surface of the heat-absorbing substrate where the first heat-generating element 31 is attached is defined as a first heat-absorbing surface and the heat-absorbing surface of the heat-absorbing substrate where the second heat-generating element 41 is attached is defined as a second heat-absorbing surface.

6. The heat-dissipating structure for the expansion board architecture of claim 1, wherein the heat-absorbing substrate further includes at least one electronic element recess or at least one electronic element hole.

7. The heat-dissipating structure for the expansion board architecture of claim 1, wherein the motherboard further includes at least one third heat-generating element 33 and at least one second expansion slot disposed on the surface of the motherboard opposite to the first expansion board.

8. The heat-dissipating structure for the expansion board architecture of claim 7, wherein the first expansion board further includes at least one fourth heat-generating element 43 and at least one third expansion slot disposed on the surface of the first expansion board opposite to the motherboard.

9. The heat-dissipating structure for the expansion board architecture of claim 7 further comprising at least one heat-absorbing board extended from the heat-dissipating board, wherein the at least one third heat-generating element 33 is attached to a third heat-absorbing surface of the heat-absorbing board.

10. The heat-dissipating structure for the expansion board architecture of claim 8 further comprising at least one heat-absorbing board extended from the heat-dissipating board, wherein the at least one fourth heat-generating element 43 is attached to a fourth heat-absorbing surface of the heat-absorbing board.

11. The heat-dissipating structure for the expansion board architecture of claim 10, wherein the heat-absorbing board further includes at least one fixing element though which the motherboard or the first expansion board is fixed thereon.

12. The heat-dissipating structure for the expansion board architecture of claim 11 further comprising a second expansion board that includes at least a second expansion bus electrically connected with the second expansion slot or the third expansion slot.

13. The heat-dissipating structure for the expansion board architecture of claim 12, wherein the second expansion board further includes at least one fifth heat-generating element 71 disposed on the same surface of the second expansion board as the second expansion bus.

14. The heat-dissipating structure for the expansion board architecture of claim 13, wherein the at least one fifth heat-generating element 71 is attached to a fourth heat-absorbing surface of the heat-absorbing board.

15. The heat-dissipating structure for the expansion board architecture of claim 12, wherein the second expansion board is fixed to the heat-absorbing board using the at least one fixing elements.

16. The heat-dissipating structure for the expansion board architecture of claim 1, wherein the upper and lower sides of the heat-dissipating board further have at least one fixing element, respectively, for the heat-dissipating structure for the expansion board architecture to stack on and fix with each other.

17. The heat-dissipating structure for the expansion board architecture of claim 1 further comprising at least one heat-dissipating housing, wherein the heat-dissipating board is fixed thereon using the at least one fixing elements.

* * * * *